United States Patent
Li

(10) Patent No.: US 10,804,343 B2
(45) Date of Patent: Oct. 13, 2020

(54) AMOLED PANEL AND METHOD FOR MANUFACTURING THE SAME

(71) Applicant: WUHAN CHINA STAR OPTOELECTRONICS TECHNOLOGY CO., LTD., Wuhan, Hubei (CN)

(72) Inventor: Songshan Li, Hubei (CN)

(73) Assignee: WUHAN CHINA STAR OPTOELECTRONICS TECHNOLOGY CO., LTD, Wuhan (CN)

( * ) Notice: Subject to any disclaimer, the term of this patent is extended or adjusted under 35 U.S.C. 154(b) by 624 days.

(21) Appl. No.: 15/541,785

(22) PCT Filed: May 31, 2017

(86) PCT No.: PCT/CN2017/086535
§ 371 (c)(1),
(2) Date: Jul. 6, 2017

(87) PCT Pub. No.: WO2018/196091
PCT Pub. Date: Nov. 1, 2018

(65) Prior Publication Data
US 2020/0013836 A1    Jan. 9, 2020

(30) Foreign Application Priority Data

Apr. 27, 2017 (CN) .......................... 2017 1 0285922

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 27/3272* (2013.01); *H01L 51/0005* (2013.01); *H01L 51/56* (2013.01)

(58) Field of Classification Search
CPC . H01L 27/3246; H01L 51/5284; H01L 51/56; H01L 51/5012; H01L 27/3272; H01L 51/0005; H01L 2251/558
See application file for complete search history.

(56) References Cited

U.S. PATENT DOCUMENTS

| 2012/0164766 A1 | 6/2012 | Yeh et al. |
| 2018/0033841 A1* | 2/2018 | Yang ................... H01L 27/3246 |
| 2018/0183012 A1 | 6/2018 | Liu et al. |

FOREIGN PATENT DOCUMENTS

CN     1794481 A    6/2006

* cited by examiner

Primary Examiner — Thanh T Nguyen

(57) ABSTRACT

An AMOLED panel is disclosed. The panel includes, from bottom up in sequence, a substrate, a first electrode layer, an opaque insulation layer, and pixel defined layers among which pixel regions are arranged. The opaque insulation layer extends to the pixel region in which an organic light emitting layer is arranged. The organic light emitting layer has a film thickness non-uniform region at a position near to an inclined surface of a pixel defined layer facing the pixel region. When observed along a normal line direction of the substrate, a projection of the film thickness non-uniform region on the opaque insulation layer is inside the opaque insulation layer. In the panel, the non-uniform light resulted by the film thickness non-uniform region can be completely shaded by the opaque insulation layer. In this manner, only light with a uniform brightness that is emitted by a film thickness uniform region can transmit through the substrate, and thus the pixel region can have a uniform brightness. Therefore, brightness uniformity of the panel can be (Continued)

improved. A method for manufacturing the panel is further disclosed. A performance of the panel can be ensured, and a product quality can be improved.

6 Claims, 4 Drawing Sheets

AMOLED PANEL AND METHOD FOR MANUFACTURING THE SAME

CROSS REFERENCE TO RELATED APPLICATION

The present application claims priority of Chinese patent application CN201710285922.5, entitled "AMOLED Panel and Method for Manufacturing the Same" and filed on Apr. 27, 2017, the entirety of which is incorporated herein by reference.

FIELD OF THE INVENTION

The present disclosure relates to the technical field of display, and particularly to an active-matrix organic light emitting diode (AMOLED) panel and a method for manufacturing the same.

BACKGROUND OF THE INVENTION

During manufacturing of an AMOLED panel through an inkjet printing technology, after thin film transistors are formed, an electrode layer is formed thereon and patterned so as to form a first electrode layer which is electrically connected with the thin film transistors. Then, pixel defined layers are formed on the first electrode layer. During manufacturing of the pixel defined layers, an organic light-resist is first coated, and then exposing, developing, and baking procedures are performed to obtain the pixel defined layers. An upper surface of each pixel defined layer is hydrophobic, while a lateral surface thereof is hydrophilic. As shown in FIG. 1, each pixel defined layer 14 obtained therein is a trapezoid with an upper base being smaller than a lower base. One pixel region 16 is arranged between each two adjacent pixel defined layers. An upper surface 142 of the pixel defined layer 14 is hydrophobic, while an inclined surface 141 thereof is hydrophilic. Since the hydrophobic and hydrophilic properties of surfaces of the pixel defined layer are difficult to control, when an organic light emitting ink is printed on the pixel region 16, there will be a problem of ink film thickness non-uniform at a position near to the inclined surface 141 of the pixel defined layer. As shown in FIG. 1, an ink film 15 between two adjacent pixel defined layers will have a film thickness non-uniform region 151 at the position near to the inclined surface 141 of the pixel defined layer 14 since the inclined surface 141 is hydrophilic. As a result, when an electric current runs through the film thickness non-uniform region 151, a problem of light emitting non-uniformity will be led to.

SUMMARY OF THE INVENTION

With respect to the problem of light emitting non-uniformity resulted from film thickness non-uniformity at an edge of an ink film, the present disclosure provides an AMOLED panel and a method for manufacturing the same.

The present disclosure provides an AMOLED panel, which comprises a substrate, a first electrode layer, and pixel defined layers arranged from bottom up in sequence. One pixel region is arranged between each two adjacent pixel defined layers, and the pixel region is provided with an organic light emitting layer which has a film thickness non-uniform region at a position near to an inclined surface of a pixel defined layer facing the pixel region. The panel further comprises an opaque insulation layer at least partially arranged between the first electrode layer and the pixel defined layers, and the opaque insulation layer extends to the pixel region. When observed along a normal line direction of the substrate, a projection of the film thickness non-uniform region on the opaque insulation layer is inside the opaque insulation layer.

When an electric current runs through the film thickness non-uniform region, light emitting non-uniformity will be resulted in. Through arranging the opaque insulation layer and enabling the projection of the film thickness non-uniform region on the opaque insulation layer to be inside the opaque insulation layer when they are observed along the normal line direction of the substrate, the non-uniform light resulted by the film thickness non-uniform region can be completely shaded by the opaque insulation layer. In this manner, only light with a uniform brightness that is emitted by a film thickness uniform region of the organic light emitting layer can transmit through the substrate, and thus the pixel region can have a uniform brightness. Therefore, brightness uniformity of the AMOLED panel can be improved.

As a further improvement on the present disclosure, the opaque insulation layer comprises a first insulation layer, an opaque layer, and a second insulation layer from bottom up in sequence.

The non-uniform light that is emitted by the film thickness non-uniform region can be shaded by the opaque insulation layer. The first insulation layer and the second insulation layer are arranged above and below the opaque layer respectively, and thus it can be ensured that the opaque layer is insulated from other layers. Therefore, the opaque insulation layer can have opaque property and insulating property at the same time.

As a further improvement on the present disclosure, the first insulation layer is made of silicon oxide or silicon nitride, and the second insulation layer is made of silicon oxide or silicon nitride. The opaque layer is made of a metal. The metal is Mo or Al.

Silicon oxide, silicon nitride, Mo, and Al are all commonly used materials during manufacturing of display panel and are easy to obtain. Therefore, a manufacturing cost of the panel can be reduced.

As a further improvement on the present disclosure, the pixel defined layers are made of an organic light-resist material. The organic light-resist material is acrylic plastic or polyimide.

The present disclosure further provides a method for manufacturing an AMOLED panel, which comprises steps of:

S11: forming a first electrode layer on a whole surface of a substrate;

S12: forming an opaque insulation layer;

S13: forming pixel defined layers, wherein one pixel region is arranged between each two adjacent pixel defined layers, and the opaque insulation layer is at least partially arranged below the pixel defined layers and extends to the pixel region; and S14: forming an organic light emitting layer in the pixel region, wherein the organic light emitting layer has a film thickness non-uniform region at a position near to an inclined surface of a pixel defined layer facing the pixel region; and wherein when observed along a normal line direction of the substrate, a projection of the film thickness non-uniform region on the opaque insulation layer is inside the opaque insulation layer.

The first electrode layer is preferably made of Indium Tin Oxide (ITO). An ITO film is first deposited on the whole surface of the substrate and then patterned through a photographic etching technology so as to form the first electrode layer. An opaque insulation film is deposited on an upper surface of the first electrode layer and patterned through photolithography technology and etching technology so as to form the opaque insulation layer. During manufacturing of the pixel defined layers, the organic light-resist is first coated, and then exposed, developed, and baked to obtain the pixel defined layers.

As an improvement on step S12, the step of forming the opaque insulation layer comprises sub steps of:

S121: forming a first insulation layer;
S122: forming an opaque layer; and
S123: forming a second insulation layer.

Further, each layer of the opaque insulation layer is made through a chemical vapor deposition method or a physical vapor deposition method.

Further, the organic light emitting layer is made through an inkjet printing technology.

In a word, in the AMOLED panel according to the present disclosure, through arranging the opaque insulation layer and enabling the projection of the film thickness non-uniform region on the opaque insulation layer to be inside the opaque insulation layer when they are observed along the normal line direction of the substrate, the non-uniform light resulted by the film thickness non-uniform region can be completely shaded by the opaque insulation layer. In this manner, only light with a uniform brightness that is emitted by the film thickness uniform region of the organic light emitting layer can transmit through the substrate, and thus the pixel region can have a uniform brightness. Therefore, brightness uniformity of the AMOLED panel can be improved. Moreover, the opaque insulation layer is preferably made of commonly used material during manufacturing of display panel, and thus a manufacturing cost thereof can be further reduced. The present disclosure further provides a method for manufacturing the AMOLED panel, and thus a performance of the panel can be ensured.

The above technical features can be combined in any suitable manner, or substituted by the equivalent technical features, as long as the purpose of the present disclosure can be achieved.

BRIEF DESCRIPTION OF THE DRAWINGS

The present disclosure will be illustrated in detail hereinafter with reference to the embodiments and the accompanying drawings. In the drawings.

Figure 1:
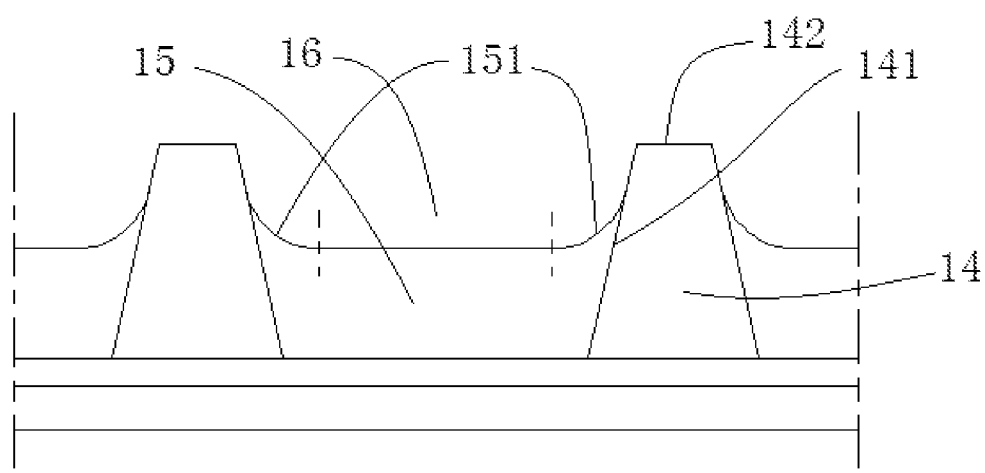
FIG. 1 schematically shows a structure of an AMOLED panel in the prior art.

In the drawings, the same components are represented by the same reference signs, and the size of each component does not represent the actual size of the corresponding component.

DETAILED DESCRIPTION OF THE EMBODIMENTS

The details of the present disclosure can be understood more clearly combining the description on the drawings and the embodiments. However, the specific embodiments disclosed herein are only used for illustrating the present disclosure, while cannot be understood as limiting the present disclosure in any manner. Those skilled in the art can make any deformations under the teaching of the technical content disclosed herein, and all the deformations fall into the scope of the present disclosure. The present disclosure will be further illustrated hereinafter with reference to the drawings.

The present disclosure will be described in detail hereinafter with reference to the accompanying drawings. The terms "upper", "lower", "right", and "left" in the following text are directions relative to the directions shown in the drawings, and should not be construed as limiting the scope of the disclosure.

Embodiment 1

Figure 2:
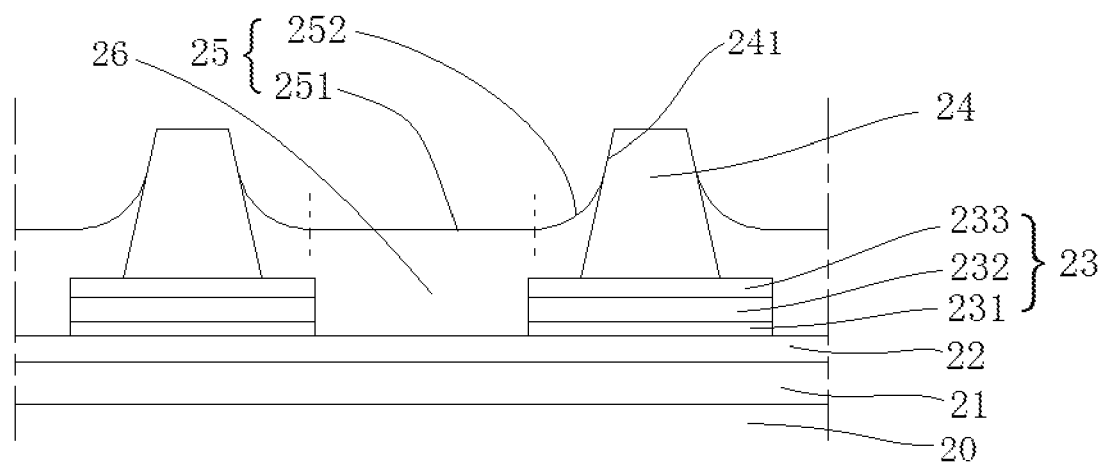
FIG. 2 schematically shows a structure of an AMOLED panel according to the present disclosure.

FIG. 2 schematically shows a structure of an AMOLED panel according to the present embodiment. It can be seen from FIG. 2 that, the AMOLED panel comprises a substrate 21, a first electrode layer 22, and pixel defined layers 24 arranged from bottom up in sequence. One pixel region 26 is arranged between each two adjacent pixel defined layers 24, and the pixel region 26 is provided with an organic light emitting layer 25. Since an inclined surface 241 of a pixel defined layer 24 facing the pixel region 26 is hydrophilic, the organic light emitting layer 25 has a film thickness non-uniform region 252 at a position near to the inclined surface 241 and a film thickness uniform region 251 at a position far from the inclined surface 241.

According to the present embodiment, the AMOLED panel further comprises an opaque insulation layer 23 (as shown in FIG. 2) at least partially arranged between the first electrode layer 22 and the pixel defined layers 24, which is different from that in the prior art. Moreover, the opaque insulation layer 23 extends to the pixel region 26. When observed along a normal line direction of the substrate 21, a projection of the film thickness non-uniform region 252 on the opaque insulation layer 23 is inside the opaque insulation layer 23.

After an electric field is applied, the organic light emitting layer 25 can emit light. The light has non-uniform brightness at a position corresponding to the film thickness non-uniform region 252, while has a uniform brightness at a position corresponding to the film thickness uniform region 251. According to the present embodiment, the opaque insulation layer 23 can play a role of shading light. Since the projection of the film thickness non-uniform region 252 on the opaque insulation layer 23 is inside the opaque insulation layer 23, the non-uniform light resulted by the film thickness non-uniform region 252 can be completely shaded by the opaque insulation layer 23. In this manner, only light with a uniform brightness that is emitted by a film thickness uniform region 251 can transmit through the substrate from a light-exiting side 20 thereof, and thus the pixel region 26 can have a uniform brightness. Therefore, brightness uniformity of the AMOLED panel can be improved.

Preferably, according to the present embodiment, the opaque insulation layer 23 comprises a first insulation layer 231, an opaque layer 232, and a second insulation layer 233 from bottom up in sequence. The opaque layer 232 can be insulated from adjacent layer by the first insulation layer 231 and the second insulation layer 233 respectively. The opaque layer 232 enables the opaque insulation layer 23 to have a good light shading performance. Preferably, the first insulation layer 231 and the second insulation layer 233 are made of silicon nitride or silicon oxide. The opaque layer 232 is made of a metal, and the metal is preferably selected to be Mo or Al. These materials are all commonly used materials during manufacturing of the panel, and thus a manufacturing cost of the panel can be further reduced. Of course, each layer of the opaque insulation layer 23 can also be made of other materials, as long as a performance of the opaque insulation layer 23 can be achieved. According to another embodiment of the present disclosure, the opaque insulation layer 23 is made of a black matrix material, such as black chrome, black photoresist, and so on.

The pixel defined layers 24 are preferably made of an organic light-resist material, such as acrylic plastic or polyimide.

Embodiment 2

Figure 3:
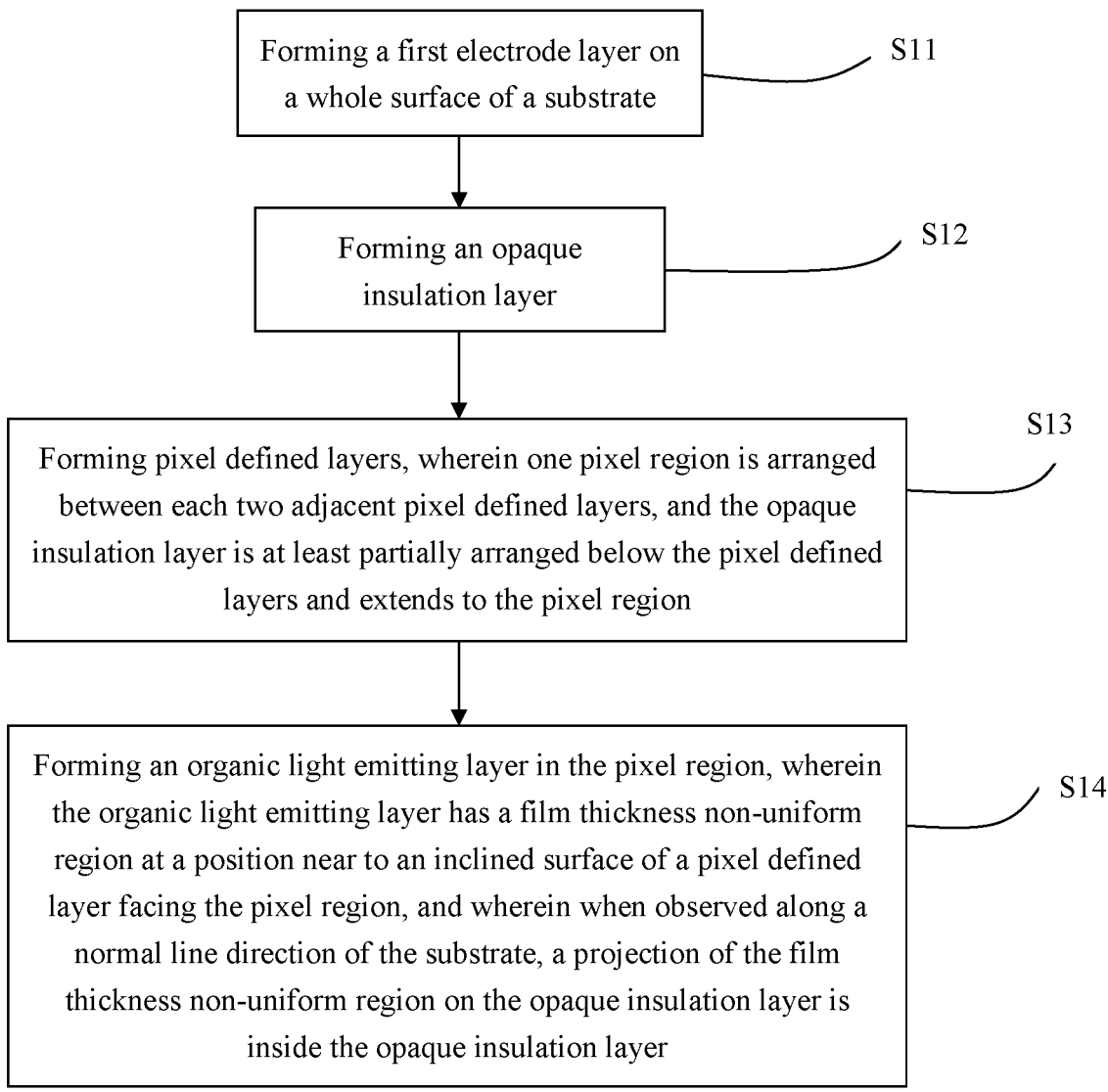
FIG. 3 is a flow chart of a method for manufacturing the AMOLED panel according to the present disclosure.

The present disclosure further provides a method for manufacturing an AMOLED panel, as shown in FIG. 3. The manufacturing procedure of the AMOLED panel will be illustrated in detail hereinafter with reference to FIG. 3.

Figure 4:
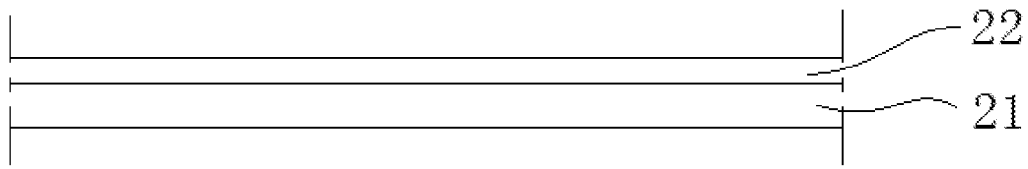
FIG. 4 schematically shows a structure of the AMOLED panel after step S11 is performed during manufacturing thereof.

In step S11, a first electrode layer 22 is formed on a whole surface of a substrate 21, as shown in FIG. 4. The first electrode layer 22 is preferably made of Indium Tin Oxide (ITO). An ITO film is first deposited on the whole surface of the substrate 21 and then patterned through a photographic etching technology so as to form the first electrode layer 22.

Figure 5:
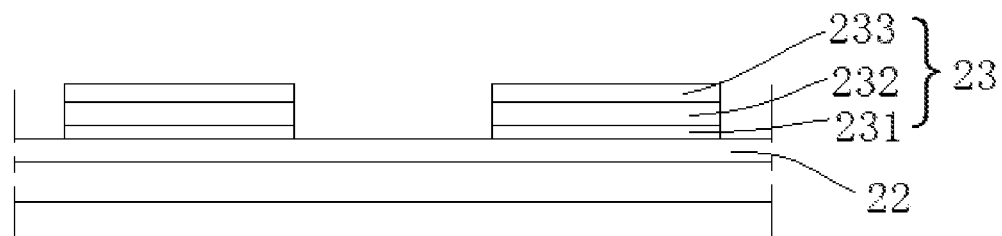
FIG. 5 schematically shows a structure of the AMOLED panel after step S12 is performed during manufacturing thereof.

In step S12, an opaque insulation layer 23 is formed, as shown in FIG. 5. An opaque insulation film is deposited on an upper surface of the first electrode layer 22 and patterned through photolithography technology and etching technology so as to form the opaque insulation layer 23. Preferably, the opaque insulation layer 23 comprises a first insulation layer 231, an opaque layer 232, and a second insulation layer 233 from bottom up in sequence. During manufacturing of the opaque insulation layer 23, first, the first insulation layer 231 is deposited through a chemical vapor deposition method or a physical vapor deposition method, and then, the opaque layer 232 and the second insulation layer 233 are deposited in sequence through the same method. At last, the opaque insulation layer 23 can be obtained after a patterning procedure.

Figure 6:
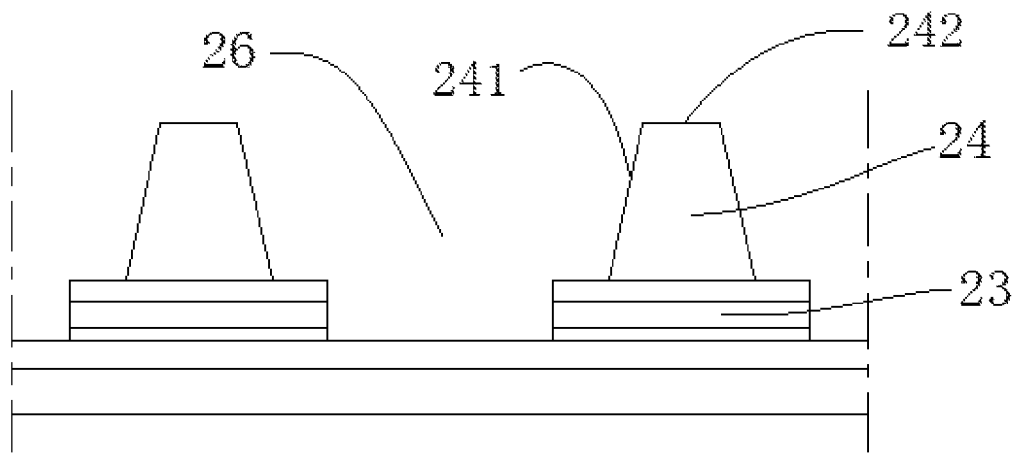
FIG. 6 schematically shows a structure of the AMOLED panel after step S13 is performed during manufacturing thereof.

In step S13, pixel defined layers are formed, as shown in FIG. 6. The pixel defined layers 24 are preferably made of an organic light-resist material. During manufacturing of the pixel defined layers 24, an organic light-resist material is first coated on a whole surface of the opaque insulation layer 23, and then exposed, developed, and baked to obtain the pixel defined layers 24. The pixel defined layers 24 manufactured through this method has a hydrophobic property on an upper surface 242 thereof, and has a hydrophilic property on an inclined surface 241 thereof.

One pixel region 26 is arranged between each two adjacent pixel defined layers 24, and the opaque insulation layer extends to the pixel region 26.

Figure 7:
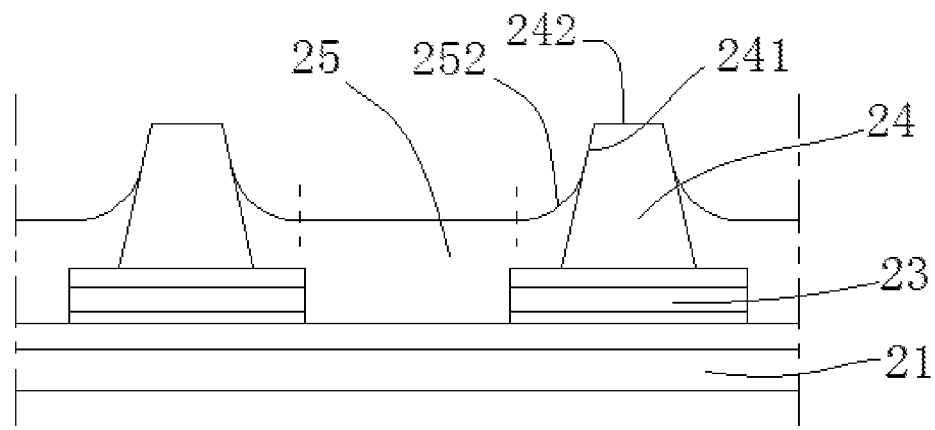
FIG. 7 schematically shows a structure of the AMOLED panel after step S14 is performed during manufacturing thereof.

In step S14, an organic light emitting layer 25 is formed in the pixel region 26, as shown in FIG. 7. According to the present embodiment, the organic light emitting layer 25 is made through an inkjet printing technology. The organic light emitting layer 25 has a film thickness non-uniform region 252 at a position near to an inclined surface 241 of a pixel defined layer 24 facing the pixel region 26. When observed along a normal line direction of the substrate 21, a projection of the film thickness non-uniform region 252 on the opaque insulation layer 23 is inside the opaque insulation layer 23.

With respect to the AMOLED panel manufactured through the method disclosed herein, a performance and a quality of the panel can be guaranteed. The pixel region can have a uniform brightness, and brightness uniformity of the AMOLED panel can be improved.

At last, it should be noted that, the above embodiments are only used for illustrating, rather than restricting the present disclosure. The present disclosure is illustrated in detail in combination with preferred embodiments hereinabove, but it can be understood that, the embodiments disclosed herein can be amended or substituted without departing from the protection scope of the present disclosure. In particular, as long as there are no structural conflicts, the technical features disclosed in each and every embodiment of the present disclosure can be combined with one another in any way, and the combined features formed thereby are within the protection scope of the present disclosure.

The invention claimed is:

1. An AMOLED panel, comprising a substrate, a first electrode layer, and pixel defined layers arranged from bottom up in sequence,
    wherein one pixel region is arranged between each two adjacent pixel defined layers, and the pixel region is provided with an organic light emitting layer which has a film thickness non-uniform region at a position near to an inclined surface of a pixel defined layer facing the pixel region;
    wherein the panel further comprises an opaque insulation layer at least partially arranged between the first electrode layer and the pixel defined layers, and the opaque insulation layer extends to the pixel region; and
    wherein when observed along a normal line direction of the substrate, a projection of the film thickness non-uniform region on the opaque insulation layer is inside the opaque insulation layer,
    wherein the opaque insulation layer comprises a first insulation layer, an opaque layer, and a second insulation layer from bottom up in sequence.

2. The panel according to claim 1, wherein the pixel defined layers are made of an organic light-resist material.

3. The panel according to claim 1, wherein the first insulation layer is made of silicon oxide or silicon nitride, and the second insulation layer is made of silicon oxide or silicon nitride.

4. The panel according to claim 3, wherein the pixel defined layers are made of an organic light-resist material.

5. The panel according to claim 1, wherein the opaque layer is made of a metal.

6. The panel according to claim 5, wherein the metal is Mo or Al.

* * * * *